（12） United States Patent
Ma (10) Patent No.: US 9,898,958 B2
(45) Date of Patent: Feb. 20, 2018

(54) SHIFT REGISTER UNIT, SHIFT REGISTER, GATE DRIVER CIRCUIT AND DISPLAY APPARATUS (71) Applicant: BOE TECHNOLOGY GROUP CO., LTD., Beijing (CN)

(72) Inventor: Zhanjie Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 215 days.

(21) Appl. No.: 14/761,842

(22) PCT Filed: Feb. 3, 2015

(86) PCT No.: PCT/CN2015/072166
§ 371 (c)(1),
(2) Date: Jul. 17, 2015

(87) PCT Pub. No.: WO2016/045294
PCT Pub. Date: Mar. 31, 2016

(65) Prior Publication Data
US 2016/0253950 A1 Sep. 1, 2016

(30) Foreign Application Priority Data

Sep. 28, 2014 (CN) .......................... 2014 1 0509811

(51) Int. Cl.
G09G 3/20 (2006.01)
G09G 3/36 (2006.01)
(Continued)

(52) U.S. Cl.
CPC ............. G09G 3/2092 (2013.01); G09G 3/36 (2013.01); G09G 3/3677 (2013.01);
(Continued)

(58) Field of Classification Search
CPC ...... G09G 3/2092; G09G 3/36; G09G 3/3677; G09G 2310/0286; G09G 2330/028; G11C 19/186; G11C 19/28
(Continued)

(56) References Cited

U.S. PATENT DOCUMENTS

2010/0007635 A1* 1/2010 Kwon .................. G09G 3/3677
345/204
2010/0177082 A1 7/2010 Joo et al.
(Continued)

FOREIGN PATENT DOCUMENTS

CN 1758321 A 4/2006
CN 101568954 A 10/2009
(Continued)

OTHER PUBLICATIONS

International Search Report and Written Opinion in Chinese for corresponding PCT Application No. PCT/CN2015/072166.
(Continued)

Primary Examiner — Stacy Khoo
(74) Attorney, Agent, or Firm — Kinney & Lange, P.A.

(57) ABSTRACT

The present disclosure provides a shift register unit and a shift register, a gate driver circuit and a display apparatus where the shift register unit can be applied. A signal amplification module including two transistors each having a small channel width is added at an output node of the shift register unit. In this way, the output capability can be improved significantly with the same design parameters in case of a high load.

20 Claims, 4 Drawing Sheets (51) Int. Cl.
*G11C 19/28* (2006.01)
*G11C 19/18* (2006.01)

(52) U.S. Cl.
CPC ............ *G11C 19/186* (2013.01); *G11C 19/28* (2013.01); *G09G 2310/0286* (2013.01); *G09G 2330/028* (2013.01)

(58) Field of Classification Search
USPC ............... 345/87, 92, 98, 99, 100, 205, 206; 327/108
See application file for complete search history.

(56) References Cited

U.S. PATENT DOCUMENTS

2011/0193853 A1* 8/2011 Sakamoto ............ G09G 3/3677 345/213
2012/0163529 A1* 6/2012 Chen ...................... G11C 19/28 377/75

FOREIGN PATENT DOCUMENTS

| | | |
|---|---|---|
| CN | 101779252 A | 7/2010 |
| CN | 101939791 A | 1/2011 |
| CN | 102629463 A | 8/2012 |
| CN | 103035218 A | 4/2013 |
| CN | 103761937 A | 4/2014 |
| CN | 104282279 A | 1/2015 |
| JP | 2004004597 A | 8/2004 |
| JP | 2009188749 A | 8/2009 |
| WO | 2011114569 A1 | 9/2011 |
| WO | WO 2013160941 A1 * 12/2015 | ............ G09G 3/3266 |

OTHER PUBLICATIONS

English Translation of Written Opinion for corresponding PCT Application No. PCT/CN2015/072166.
First Chinese Office Action including English translation dated Feb. 1, 2016, for corresponding Chinese Application No. 201410509811.4.

* cited by examiner

SHIFT REGISTER UNIT, SHIFT REGISTER, GATE DRIVER CIRCUIT AND DISPLAY APPARATUS

TECHNICAL FIELD

The present disclosure relates to display driver circuit technology in electrical and electronic industry, and more particular, to a shift register unit and a shift register, a gate driver circuit and a display apparatus where the shift register unit can be applied.

BACKGROUND

Liquid Crystal Displays (LCDs) have been widely applied in various products or components having display functions, such as smartphones, tablet computer, televisions, displays, notebook computers, cameras, video recorders, digital photo frames, navigators and the like, due to their advantages of low power consumption, light weight, thinness, free of electromagnetic radiation and free of pollution.

In a conventional LCD, a pixel array may include gate scan lines and data lines that are interlaced with each other. In order to achieve progressive scanning of a pixel array, a gate driver circuit is typically used for providing the gate scan lines of the pixel array with scanning signals.

Conventionally, a gate driver circuit typically employs a Gate Driver on Array (GOA) design where a Thin Film Transistor (TFT) gate switching circuit is integrated onto an array substrate of a display panel, so as to constitute a scanning driver for the display panel. Such gate driver circuit integrated onto the array substrate utilizing the GOA technique is also referred to as a GOA circuit or a shift register circuit.

However, in the conventional shift register unit, when a load on an output port is increased, its output capability degrades. In order to improve the output capability with the conventional structure, the width of its transistor channel has to be increased significantly, which will occupy a large design space.

SUMMARY

In order to solve the above problem, the present disclosure provides a shift register unit capable of providing a substantially constant output capability in case of a high load, and a shift register, a gate driver circuit and a display apparatus where the shift register unit can be applied.

According to an aspect of the present disclosure, a shift register unit is provided. The shift register unit comprises: an input module adapted to provide an input signal STV to a first node A in response to a first clock signal inputted at a first clock signal input terminal; a pull-up module adapted to provide a positive voltage VGH of a power supply to a second node C in response to the input signal STV; a pull-down module adapted to provide a negative voltage VGL of the power supply to the second node C in response to a third clock signal inputted at a third clock signal input terminal; a reset module adapted to provide the positive voltage VGH of the power supply to the first node A in response to a signal at the second node C; a first output module adapted to provide the positive voltage VGH of the power supply to an output node Output of the shift register unit in response to the signal at the second node C, a second capacitor C2 being provided between the positive voltage VGH of the power supply and the second node C; a second output module adapted to provide a second clock signal inputted at a second clock signal terminal to a third node D in response to a signal at the first node A, a first capacitor C1 being provided between the third node D and the first node A; and a signal amplification module formed to have an inverter structure and provided between the third node D and the output node Output of the shift register unit and adapted to amplify signal at the third node D for outputting to the output node Output of the shift register unit.

According to another aspect of the present disclosure, a shift register is provided. The shift register comprises n stages of shift register units as above, where n>=2. A signal outputted from an output port Output of each shift register unit serves as an input signal STV of the shift register unit at its next stage.

According to another aspect of the present disclosure, a gate driver circuit is provided. The gate driver circuit comprises the above shift register.

According to another aspect of the present disclosure, a display apparatus is provided. The display apparatus comprises the above gate driver circuit.

With the shift register unit and the shift register, the gate driver circuit and the display apparatus where the shift register unit can be applied according to the present disclosure, only a signal amplification module including two transistors each having a small channel width is added to the conventional shift register unit. In this way, the output capability can be improved significantly with the same design parameters in case of a high load. The present disclosure also achieves a small occupation of design space and a low implementation cost.

DETAILED DESCRIPTION OF THE EMBODIMENTS

In the following, the embodiments of the present disclosure will be further detailed with reference to the figures, such that the objects, solutions and advantages of the present disclosure will become more apparent. It is to be noted that, throughout the figures and description, the same reference numerals will be used for same or similar elements. The implementations not shown or described in the figures can be appreciated by those skilled in the art. In addition, while examples with specific values of parameters are provided herein, it can be appreciated that these parameters are not necessarily equal to such values, but can be approximate to them within an acceptable error tolerance or design constraint.

With the shift register unit according to the embodiment of the present disclosure, only two transistors each having a small channel width are added to the conventional shift register unit. In this way, the output capability can be improved significantly with the same design parameters in case of a high load.

First Embodiment

Figure 1:
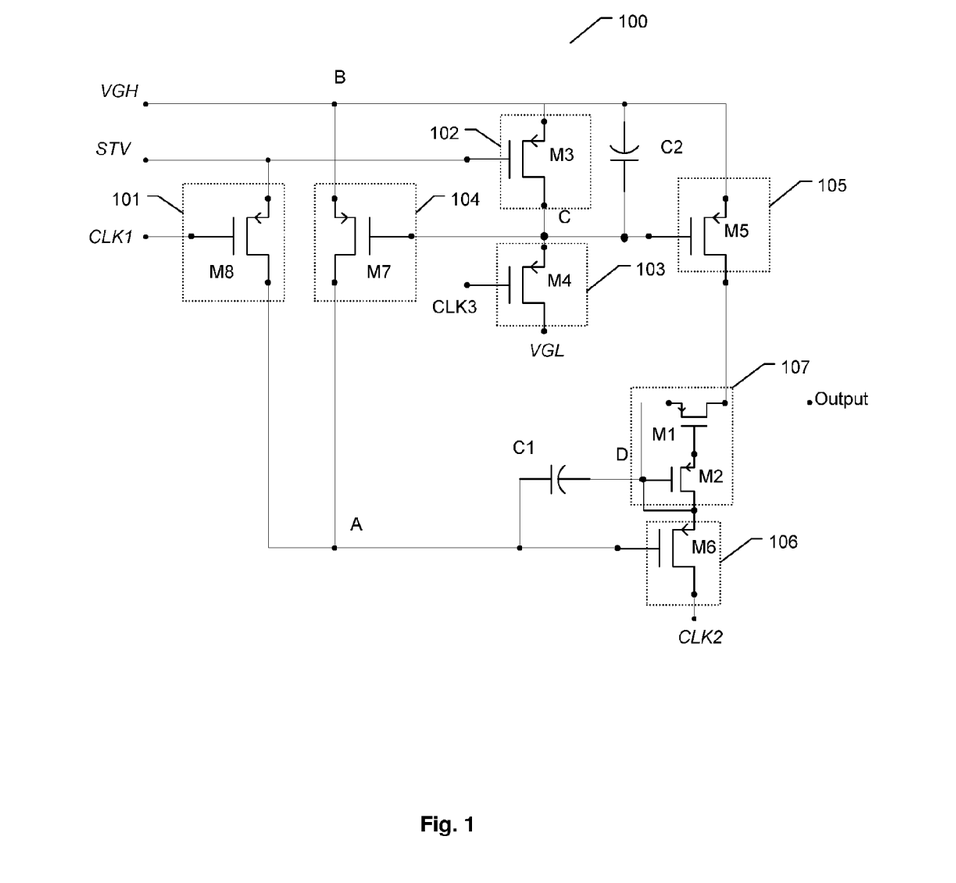
FIG. 1 is a schematic diagram showing a structure of a shift register unit according to a first embodiment of the present disclosure.

According to an exemplary embodiment of the present disclosure, a shift register unit is provided. FIG. 1 is a schematic diagram showing a structure of a shift register unit according to this embodiment. As shown in FIG. 1, the shift register unit 100 according to this embodiment includes the following modules.

An input module 101 provides an input signal STV to a first node A in response to a first clock signal CLK1 inputted at a first clock signal input terminal. Here, the first node A is an output node of the input module 101.

A pull-up module 102 provides a positive voltage VGH of a power supply to a second node C in response to the input signal STV.

A pull-down module 103 provides a negative voltage VGL of the power supply to the second node C in response to a third clock signal CLK3 inputted at a third clock signal input terminal. The second node C is a common output node of the pull-up module 102 and the pull-down module 103.

A reset module 104 provides the positive voltage VGH of the power supply to the first node A in response to a signal at the second node C.

A first output module 105 provides the positive voltage VGH of the power supply to an output node Output of the shift register unit in response to the signal at the second node C. A second capacitor C2 is provided between the positive voltage VGH of the power supply and the second node C.

A second output module 106 provides a second clock signal CLK2 inputted at a second clock signal terminal to a third node D in response to a signal at the first node A. A first capacitor C1 is provided between the third node D and the first node A.

A signal amplification module 107 is formed to have an inverter structure and is provided between the third node D and the output node Output of the shift register unit and adapted to amplify signal at the third node D for outputting.

The respective components of the shift register unit according to this embodiment will be detailed below with reference to FIG. 1.

Referring to FIG. 1, the input module 101 includes an eighth P-type Thin Film Transistor (TFT) M8 having its gate connected to the first clock signal input terminal, its source connected to receive the input signal STV and its drain connected to the first node A.

Referring to FIG. 1, the pull-up module 102 includes a third P-type TFT M3 having its gate connected to receive the input signal STV, its source connected to the positive voltage VGH of the power supply and its drain connected to the second node C.

Referring to FIG. 1, the pull-down module 103 includes a fourth P-type TFT M4 having its gate connected to the third clock signal input terminal, its drain connected to the negative voltage VGL of the power supply and its source connected to the second node C.

Referring to FIG. 1, the reset module 104 includes a seventh P-type TFT M7 having its gate connected to the second node C, its source connected to the positive voltage VGH of the power supply and its drain connected to the first node A.

Referring to FIG. 1, the first output module 105 includes a fifth P-type TFT M5 having its gate connected to the second node C, its source connected to the positive voltage VGH of the power supply and its drain connected to the output node Output. The second capacitor C2 is provided between the gate and the source of the fifth P-type TFT M5.

Referring to FIG. 1, the second output module 106 includes a sixth P-type TFT M6 having its gate connected to the first node A, its drain connected to the second clock signal input terminal and its source connected to the third node D. The first capacitor is provided between the source and gate of the sixth P-type TFT M6.

Referring to FIG. 1, the signal amplification module 107 includes a first P-type TFT M1 having its gate connected to a source of a second P-type TFT M2, its source connected to the third node D and its drain connected to the output node Output, and a second TFT M2 having its gate and drain both connected to the third node D.

It can be seen from FIG. 1 that, in the shift register unit according to this embodiment, the signal amplification module 107 having an inverter structure is added at the output terminal of the sixth P-type TFT M6. The signal amplification module 107 adds the second TFT M2 and the first P-type TFT M1 having signal amplification function to the output terminal of the sixth P-type TFT M6, so as to improve the output capability of the sixth P-type TFT M6.

It is to be noted that each of the second TFT M2 and the first P-type TFT M1 can be a transistor having a small channel width, which is sufficient to improve the output capability of the sixth P-type TFT M6 significantly. When compared with the solution that improves the output capability of the sixth P-type TFT M6 by increasing the channel width of each of the fifth P-type TFT M5 and the sixth P-type TFT M6, the cost of the shift register unit according to the embodiment of the present disclosure is much lower.

It can be appreciated by those skilled in the art that the small channel width as described above is dependent on the load connected to the shift register unit and thus cannot be represented by a specific numerical value. The structure according to the present disclosure can reduce the channel length, meaning that for the same load, the TFT channel length can be reduced when compared to a shift register unit having a different structure. That is, it is a relative result and is not limited to any specific numerical value.

Of course, it can be appreciated by those skilled in the art that, while the specific structure of the shift register unit according to the embodiment of the present disclosure has been shown in FIG. 1, the principle of the present disclosure can be applied to shift register units having other structures. The structure shown in FIG. 1 is merely an example and the present disclosure is not limited thereto.

In this embodiment, all TFTs are P-type TFTs which are turned on at a low level and turned off at a high level.

Figure 2:
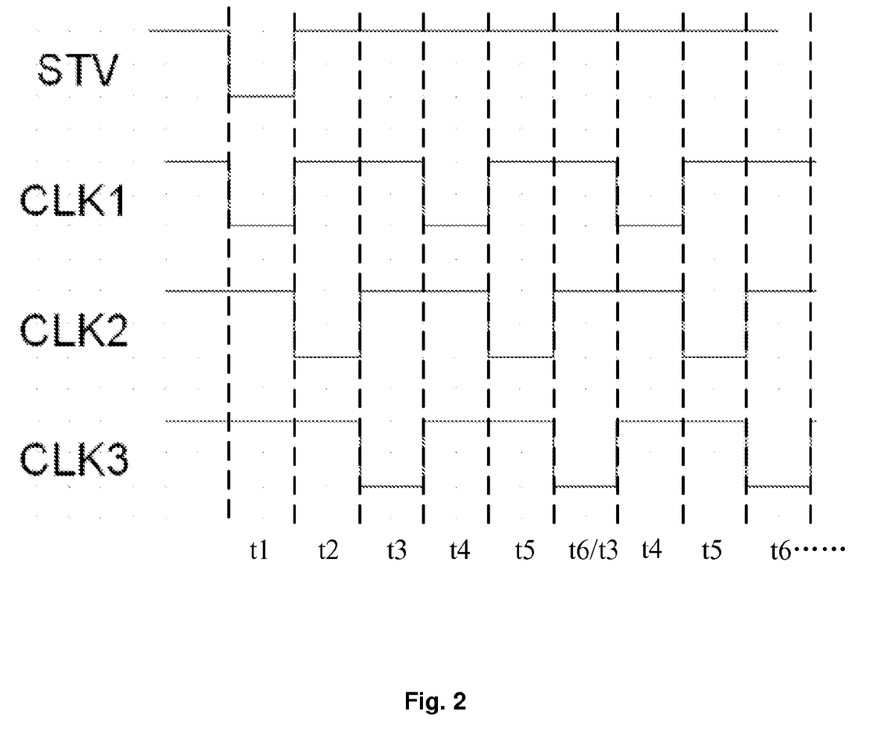
FIG. 2 is a timing sequence diagram of respective signals in the shift register unit of FIG. 1.

FIG. 2 is a timing sequence diagram of respective signals in the shift register unit of FIG. 1. As shown in FIG. 2, to drive the shift register unit according to this embodiment, the first, second and third clock signals have the same frequency, the first clock signal is enabled synchronously with the input signal STV, the second clock signal has a phase shift of 120° with respect to the first clock signal, and the third clock signal has a phase shift of 120° with respect to the second clock signal. Referring to FIG. 2, the operation principles of the shift register unit according to this embodiment will be described below.

In the first period (t1), STV and CLK1 are at a low level and CLK2 and CLK3 are at a high level. The eighth P-type TFT M8 controlled by CLK1 is turned on, such that the low level signal STV is transferred to the gate of the sixth P-type TFT M6 and stored at the first capacitor C1. At the same time, the low level signal turns on the sixth P-type TFT M6, such that the high level signal CLK2 is transferred to the output node Output via the sixth P-type TFT M6. The third P-type TFT M3 controlled by STV is turned on, such that the high level signal VGH is inputted to the gate of the fifth P-type TFT M5 and stored at the second capacitor C2. In this period, the seventh P-type TFT M7, the fourth P-type TFT M4 and the fifth P-type TFT M5 are turned off.

In the second period (t2), STV and CLK1 are changed to a high level, CLK2 is changed to a low level, and CLK3 remains at a high level. In this case, the gate potential of the sixth P-type TFT M6 as stored at the first capacitor C1 maintains the sixth P-type TFT M6 at an ON state. The low level signal CLK2 is transferred to the second P-type TFT M2 and the first P-type TFT M1 having signal amplification function via the sixth P-type TFT M6, such that they can improve the output capability of CLK2 and transfer the amplified signal to the output terminal Output. At this time, the high level signal at the gate of the fifth P-type TFT M5 is stored at the second capacitor C2, such that the fifth P-type TFT M5 and the seventh P-type TFT M7 are maintained in an OFF state. In this period, the high level signal CLK1 turns off the eighth P-type TFT M8, the high level signal STV turns off the third P-type TFT M3 and the high level signal CLK3 maintains the fourth P-type TFT M4 at an OFF state.

In the third period (t3), STV and CLK1 remain at a high level, CLK2 is changed to a high level, and CLK3 is changed to a low level. The low level signal CLK3 turns on the fourth P-type TFT M4. The low level VGL signal is transferred to the gate of the fifth P-type TFT M5 and the gate of the seventh P-type TFT M7 via the fourth P-type TFT M4 and stored at the second capacitor C2. The low level VGL signal turns on the seventh P-type TFT M7. The VGH signal is transferred to the gate of the sixth P-type TFT M6 via the seventh P-type TFT M7, such that the sixth P-type TFT M6 is turned off and it is stored at the first capacitor C1. After the sixth P-type TFT M6 is turned off, the second P-type TFT M2 and the first P-type TFT M1 are turned off. The low level VGL signal turns on the fifth P-type TFT M5, such that the VGH signal is transferred to the output node Output via the fifth P-type TFT M5. In this period, the high level signal CLK1 turns off the eighth P-type TFT M8 and the high level signal STV turns off the third P-type TFT M3.

In the fourth period (t4), CLK1 is changed to a low level while STV remains at a high level. CLK2 remains at a high level and CLK3 is changed to a high level. The low level signal CLK1 turns on the eighth P-type TFT M8. The high level signal STV is transferred to the gate of the sixth P-type TFT M6 via the eighth P-type TFT M8, such that the sixth P-type TFT M6 is turned off and it is stored at the first capacitor C1. At this time, the gate of the fifth P-type TFT M5 is at the VGL signal as maintained in the previous period. Accordingly, the fifth P-type TFT M5 remains ON, such that the VGH signal is transferred to the output node Output. In this period, the seventh P-type TFT M7 remains ON, the high level signal STV maintains the third P-type TFT M3 at the OFF state and the high level signal CLK3 turns off the fourth P-type TFT M4.

In the fifth period (t5), STV remains at a high level, CLK1 is changed to a high level, CLK2 is changed to a low level and CLK3 remains at a high level. At this time, the gate of the sixth P-type TFT M6 is at a high level as maintained in the previous period and the sixth P-type TFT M6 is in an OFF state. The gate of M5 is at a low level as maintained at the second capacitor C2 in the previous period. Accordingly, the fifth P-type TFT M5 is still ON and the VGH signal is still transferred to the output terminal Output via the fifth P-type TFT M5. In this period, the high level signal CLK1 turns off the eighth P-type TFT M8. The seventh P-type TFT M7 remains ON. The high level signal STV maintains the third P-type TFT M3 at the OFF state and the high level signal CLK3 turns off the fourth P-type TFT M4.

The sixth period (t6) is the same as the third period.

The operations in the remaining periods are the same as those in the fourth to sixth periods. Accordingly, the VGH signal is constantly outputted at the output terminal Output.

Figure 3:
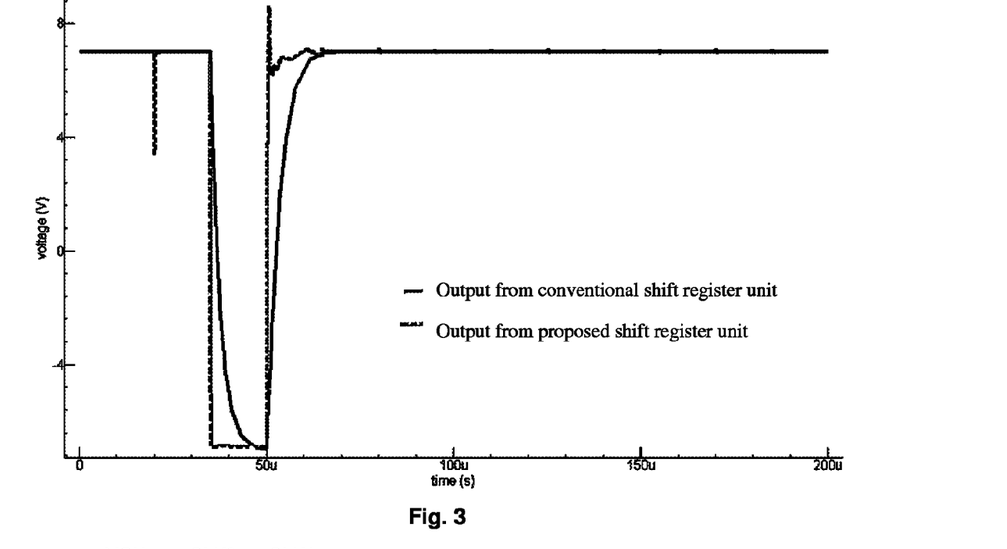
FIG. 3 is a graph showing a comparison between output capabilities of a conventional shift register unit and the shift register unit of FIG. 1.

FIG. 3 is a graph showing a comparison between output capabilities of a conventional shift register unit and the shift register unit of FIG. 1. It can be seen from FIG. 3 that, when compared with the conventional shift register unit, the shift register unit according to this embodiment has significantly improved ascending and descending capabilities in the curve. Meanwhile, the shift register unit according to this embodiment has a small occupation of design space and low implementation cost.

Second Embodiment

In a second exemplary embodiment of the present disclosure, another shift register unit is provided. This shift register unit differs from the shift register unit of the first embodiment in that all the transistors in the shift register unit are N-type TFTs.

In this embodiment, the high/low levels of the respective signals in the shift register unit shown in FIG. 1 are inverted and the positions of the positive voltage VGH and the negative voltage VGL of the power supply are swapped.

Third Embodiment

Figure 4:
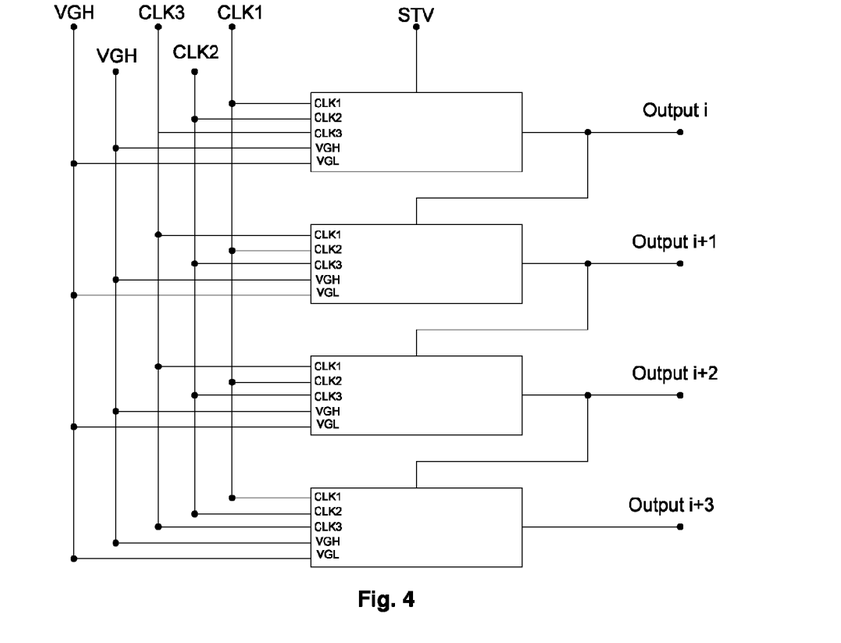
FIG. 4 is a schematic diagram showing a structure of a portion of a shift register according to an embodiment of the present disclosure.

In a third exemplary embodiment of the present disclosure, a cascaded shift register is provided. The shift register includes n cascaded shift register units according to the first or second embodiment, where n>=2. FIG. 4 shows only a portion of the shift register, i.e., four shift register units.

Referring to FIG. 4, the positive voltage VGH and the negative voltage VGL of the power supply are provided to each shift register unit. The output terminal Output of each shift register unit is connected to the input signal terminal STV of the shift register unit at its next stage.

As shown in FIG. 4, in the shift register, the clock signals for three consecutive shift register units, i.e., the shift register units at consecutive stages i, i+1 and i+3, satisfy the following relations.

(1) For the shift register unit at stage i, the clock signal inputted at its first clock signal input terminal is CLK1, the clock signal inputted at its second clock signal input terminal is CLK2, and the clock signal inputted at its third clock signal input terminal is CLK3.

(2) For the shift register unit at stage i+1, the clock signal inputted at its first clock signal input terminal is CLK2, the clock signal inputted at its second clock signal input terminal is CLK3, and the clock signal inputted at its third clock signal input terminal is CLK1.

(3) For the shift register unit at stage i+2, the clock signal inputted at its first clock signal input terminal is CLK3, the clock signal inputted at its second clock signal input terminal is CLK1, and the clock signal inputted at its third clock signal input terminal is CLK2.

It can be appreciated by those skilled in the art that, as shown in FIG. 4, for the shift register unit at stage i+3, its inputted clock signals are the same as those for the shift register unit at stage i, i.e., the clock signal inputted at its first clock signal input terminal is CLK1, the clock signal inputted at its second clock signal input terminal is CLK2, and the clock signal inputted at its third clock signal input terminal is CLK3, and so on.

It is to be noted that i is an integer greater than or equal to 1, and i+2<=n.

Figure 5:
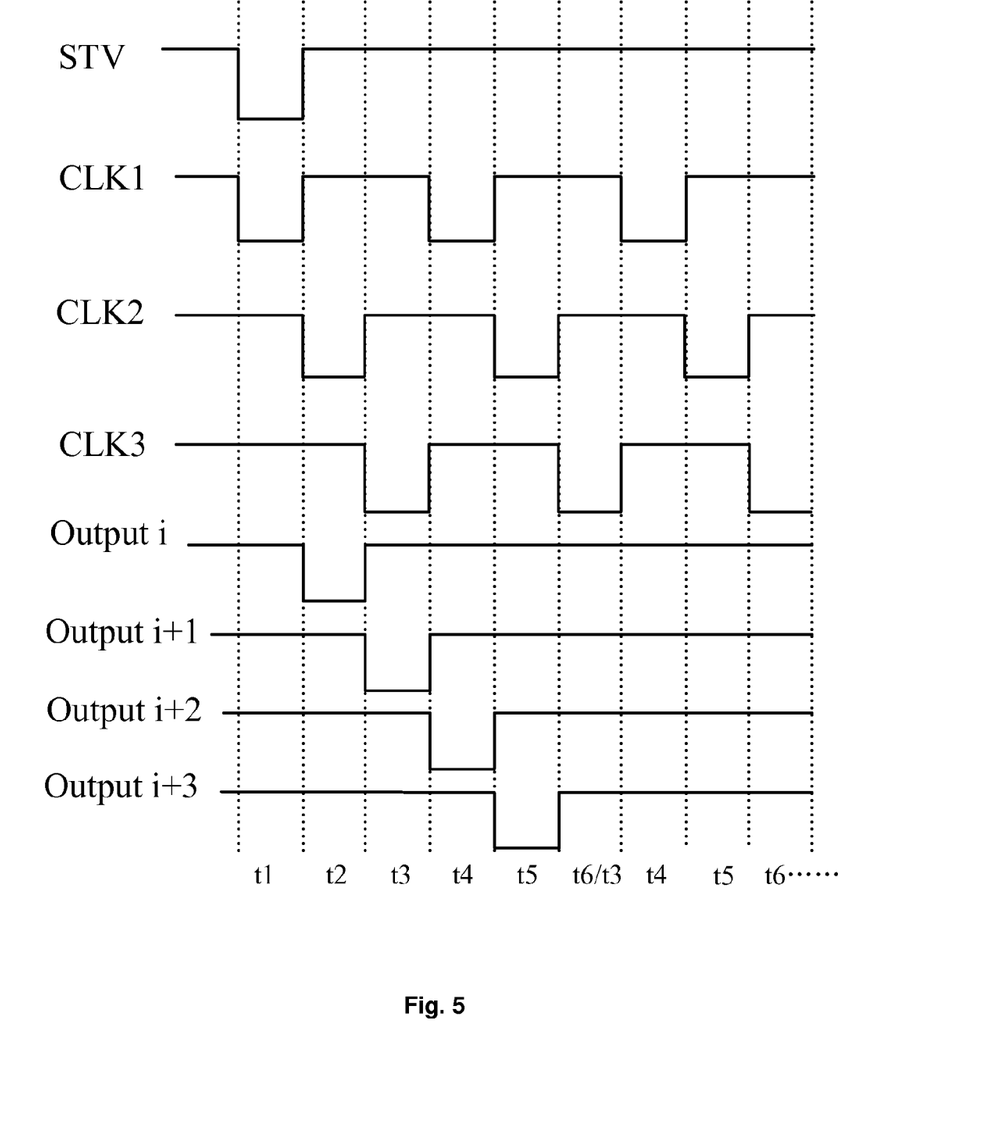
FIG. 5 is a timing sequence diagram of respective signals in the shift register of FIG. 4.

Referring to FIG. 5, in the shift register, the timing of the high level signal in the output signal of each shift register unit is delayed when compared to that of the shift register unit at its preceding stage.

It can be appreciated by those skilled in the art that the number of the cascaded shift register units can be designed as desired and can be any number greater than or equal to 3, as long as the clock signals follow the above rules.

Fourth Embodiment

In a fourth exemplary embodiment of the present disclosure, a gate driver circuit is provided. The gate driver circuit includes the shift register according to the third embodiment of the present disclosure. Other components than the shift register in the gate driver circuit can be those used in a conventional gate driver circuit and details thereof will be omitted.

Fifth Embodiment

In a fifth exemplary embodiment of the present disclosure, a display apparatus is provided. The display apparatus includes the gate driver circuit according to the fourth embodiment of the present disclosure. Other components than the gate driver circuit in the display apparatus can be those used in a conventional display apparatus and details thereof will be omitted.

Heretofore, the five embodiments of the present disclosure have been described with reference to the figures. From the above description, the shift register unit and the shift register, the gate driver circuit and the display apparatus where the shift register unit can be applied according to the present disclosure are believed to be apparent to those skilled in the art.

In addition, the definitions of the respective elements and method as described above are not limited to the specific structures, shapes or schemes mentioned in the embodiments. Modifications and alternations can be made by those skilled in the art as desired.

To summarize, in the shift register unit according to the present disclosure, two small transistors are added to a conventional shift register unit to form an inverter structure. In this way, the output capability can be significantly improved in case of a high load. When compared with the conventional structure, both the ascending and descending capabilities in the curve can be greatly improved. With such shift register unit, the performances of the shift register, the gate driver circuit and the display apparatus can be improved accordingly when compared with those of the corresponding conventional apparatuses. Meanwhile, the implementation cost is relatively low, with little increase in cost.

While the objects, solutions and advantageous effects of the present disclosure have been explained in detail with reference to the above embodiments, it should be noted that these embodiments are illustrative only, rather than limiting the scope of the present disclosure. Any modifications, equivalent alternations and improvements that can be made without departing from the spirit and principle of the present disclosure are to be encompassed by the scope of the present disclosure.

What is claimed is:

1. A shift register unit, comprising:
an input module adapted to provide an input signal to a first node in response to a first clock signal inputted at a first clock signal input terminal;
a pull-up module adapted to provide a positive voltage of a power supply to a second node in response to the input signal;
a pull-down module adapted to provide a negative voltage of the power supply to the second node in response to a third clock signal inputted at a third clock signal input terminal;
a reset module adapted to provide the positive voltage of the power supply to the first node in response to a signal at the second node;
a first output module adapted to provide the positive voltage of the power supply to an output node of the shift register unit in response to the signal at the second node, a second capacitor being provided between the positive voltage of the power supply and the second node;
a second output module adapted to provide a second clock signal inputted at a second clock signal input terminal to a third node in response to a signal at the first node, a first capacitor being provided between the third node and the first node; and
a signal amplification module provided between the third node and the output node of the shift register unit and adapted to amplify a signal at the third node for outputting to the output node of the shift register unit.

2. The shift register unit of claim 1, wherein the signal amplification module is formed to have an inverter structure, comprising:
a first P-type thin film transistor (TFT) and a second P-type TFT, wherein the first P-type TFT has its gate connected to a source of the second P-type TFT, its source connected to the third node and its drain connected to the output node of the shift register unit; and
the second P-type TFT having its gate and drain both connected to the third node.

3. The shift register unit of claim 2, wherein the pull-up module comprises:
a third P-type TFT having its gate connected to receive the input signal, its source connected to the positive voltage of the power supply and its drain connected to the second node.

4. The shift register unit of claim 3, wherein the pull-down module comprises:
a fourth P-type TFT having its gate connected to the third clock signal input terminal, its drain connected to the negative voltage of the power supply and its source connected to the second node.

5. The shift register unit of claim 4, wherein the first output module comprises:
a fifth P-type TFT having its gate connected to the second node, its source connected to the positive voltage of the power supply and its drain connected to the output node of the shift register unit.

6. The shift register unit of claim 5, wherein the second output module comprises:
a sixth P-type TFT having its gate connected to the first node, its drain connected to the second clock signal input terminal and its source connected to the third node.

7. The shift register unit of claim 6, wherein the reset module comprises:
a seventh P-type TFT having its gate connected to the second node, its source connected to the positive voltage of the power supply and its drain connected to the first node.

8. The shift register unit of claim 7, wherein the first, second and third clock signals have a same frequency, the first clock signal is enabled synchronously with the input signal, the second clock signal has a phase shift of 120° with respect to the first clock signal, and the third clock signal has a phase shift of 120° with respect to the second clock signal.

9. A shift register, comprising n stages of the shift register unit of claim 1, where n>=2, wherein a signal outputted from an output port of each shift register unit serves as the input signal of the shift register unit at its next stage.

10. The shift register of claim 9, wherein in a case that n>=3, shift register units at consecutive stages i, i+1 and i+3 satisfy the following:
the first clock signal is inputted simultaneously to the first clock signal input terminal of the shift register unit at stage i, the third clock signal input terminal of the shift register unit at stage i+1 and the second clock signal input terminal of the shift register unit at stage i+2;
the second clock signal is inputted simultaneously to the second clock signal input terminal of the shift register unit at stage i, the first clock signal input terminal of the shift register unit at stage i+1 and the third clock signal input terminal of the shift register unit at stage i+2; and
the third clock signal is inputted simultaneously to the third clock signal input terminal of the shift register unit at stage i, the second clock signal input terminal of the shift register unit at stage i+1 and the first clock signal input terminal of the shift register unit at stage i+2,
where i is an integer greater than or equal to 1, and i+2<=n.

11. The shift register of claim 10, wherein the signal amplification module is formed to have an inverter structure, comprising:
a first P-type thin film transistor (TFT) and a second P-type TFT, wherein the first P-type TFT has its gate connected to a source of the second P-type TFT, its source connected to the third node and its drain connected to the output node of the shift register unit; and
wherein the second P-type TFT has its gate and drain both connected to the third node.

12. The shift register of claim 11, wherein the pull-up module comprises:
a third P-type TFT having its gate connected to receive the input signal, its source connected to the positive voltage of the power supply and its drain connected to the second node.

13. The shift register of claim 12, wherein the pull-down module comprises:

a fourth P-type TFT having its gate connected to the third clock signal input terminal, its drain connected to the negative voltage of the power supply and its source connected to the second node.

14. The shift register of claim 13, wherein the first output module comprises:
a fifth P-type TFT having its gate connected to the second node, its source connected to the positive voltage of the power supply and its drain connected to the output node of the shift register unit.

15. The shift register of claim 14, wherein the second output module comprises:
a sixth P-type TFT having its gate connected to the first node, its drain connected to the second clock signal input terminal and its source connected to the third node.

16. The shift register of claim 15, wherein the reset module comprises:
a seventh P-type TFT having its gate connected to the second node, its source connected to the positive voltage of the power supply and its drain connected to the first node.

17. The shift register of claim 16, wherein the first, second and third clock signals have a same frequency, the first clock signal is enabled synchronously with the input signal, the second clock signal has a phase shift of 120° with respect to the first clock signal, and the third clock signal has a phase shift of 120° with respect to the second clock signal.

18. A gate driver circuit, comprising the shift register of claim 9.

19. A display apparatus, comprising the gate driver circuit of claim 18.

20. The gate driver circuit of claim 18, wherein in a case that n>=3, a shift register units at consecutive stages i, i+1 and i+3 satisfy the following:
the first clock signal is inputted simultaneously to the first clock signal input terminal of the shift register unit at stage i, the third clock signal input terminal of the shift register unit at stage i+1 and the second clock signal input terminal of the shift register unit at stage i+2;
the second clock signal is inputted simultaneously to the second clock signal input terminal of the shift register unit at stage i, the first clock signal input terminal of the shift register unit at stage i+1 and the third clock signal input terminal of the shift register unit at stage i+2; and
the third clock signal is inputted simultaneously to the third clock signal input terminal of the shift register unit at stage i, the second clock signal input terminal of the shift register unit at stage i+1 and the first clock signal input terminal of the shift register unit at stage i+2,
where i is an integer greater than or equal to 1, and i+2<=n.

* * * * *